(12) United States Patent
Hwang et al.

(10) Patent No.: US 7,675,099 B2
(45) Date of Patent: Mar. 9, 2010

(54) IMAGE SENSOR AND METHOD OF FORMING THE SAME

(75) Inventors: Sung-Ho Hwang, Seoul (KR); Duck-Hyung Lee, Seongnam-si (KR); Chang-Rok Moon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 11/999,227

(22) Filed: Dec. 4, 2007

(65) Prior Publication Data

US 2008/0128845 A1 Jun. 5, 2008

(30) Foreign Application Priority Data

Dec. 4, 2006 (KR) .................. 10-2006-0121670

(51) Int. Cl.
*H01L 31/113* (2006.01)

(52) U.S. Cl. .................. 257/292; 257/444; 257/460; 257/E33.072; 250/200; 359/619; 348/308

(58) Field of Classification Search .............. 257/460, 257/292, 444, E33.072; 359/619; 348/308; 250/200
See application file for complete search history.

(56) References Cited

U.S. PATENT DOCUMENTS

| | | | | |
|---|---|---|---|---|
| 5,598,016 | A | * | 1/1997 | Tanabe et al. .............. 257/229 |
| 6,821,809 | B2 | | 11/2004 | Abe et al. |
| 7,208,742 | B1 | * | 4/2007 | Zelakiewicz et al. ... 250/370.11 |
| 7,238,562 | B2 | | 7/2007 | Jang |
| 2005/0056902 | A1 | * | 3/2005 | Abe et al. .................. 257/428 |
| 2006/0003519 | A1 | | 1/2006 | Jang |
| 2006/0146233 | A1 | | 7/2006 | Park |
| 2007/0153860 | A1 | * | 7/2007 | Chang-Hasnain et al. .................. 372/50.124 |
| 2007/0165203 | A1 | * | 7/2007 | Bleeker ...................... 355/67 |
| 2007/0194401 | A1 | * | 8/2007 | Nagai et al. ............... 257/447 |

FOREIGN PATENT DOCUMENTS

| | | |
|---|---|---|
| JP | 3-276677 | 12/1991 |
| JP | 7-170366 | 7/1995 |
| JP | 2003-142671 | 5/2003 |
| JP | 2006-80457 | 3/2006 |
| JP | 200680457 | * 3/2006 |
| JP | 2006080457 | * 3/2006 |
| KR | 2000-0003491 | 1/2000 |
| KR | 10-2006-0002260 | 1/2006 |
| KR | 10-2006-0077173 | 7/2006 |

OTHER PUBLICATIONS

Palik, Edward D., Handbook of Optical Constants of Solids, 1998, Elsevier, (pp. 399, 729).*

* cited by examiner

*Primary Examiner*—Davienne Monbleau
*Assistant Examiner*—Hajar Kolahdouzan
(74) *Attorney, Agent, or Firm*—Mills & Onello, LLP

(57) ABSTRACT

Provided are an image sensor and a method of forming the image sensor. The image sensor has a base multi-layered reflection layer interposed between a photodiode and an interlayer insulating layer. The photodiode has a first surface adjacent to the interlayer insulating layer and a second surface opposite the first surface. Here, external light is incident on the second surface of the photodiode. Also, the image sensor includes a sidewall multi-layered reflection layer that encloses the photodiode.

3 Claims, 17 Drawing Sheets

IMAGE SENSOR AND METHOD OF FORMING THE SAME

CROSS-REFERENCE TO RELATED APPLICATIONS

This U.S. non-provisional patent application claims priority under 35 U.S.C. §119 to Korean Patent Application No. 10-2006-0121670, filed on Dec. 4, 2006, the entire contents of which are hereby incorporated by reference.

FIELD OF THE INVENTION

The present invention disclosed herein relates to a semiconductor device and a method of forming the same, and more particularly, to an image sensor that converts incident light to electrical signals and to a method of forming the image sensor.

BACKGROUND

An image sensor of a semiconductor device is a device that converts an optical image to electrical signals. The image sensor has a light receiver that receives light from the outside and converts it to electrical signals. A photodiode is a representative type of light receiver. When external light is incident on a depletion region in the photodiode, electron-hole pairs are generated, and the external light is converted to electrical signals.

Spectral sensitivity is one of crucial characteristics of an image sensor. The higher the percentage of incident light absorbed by the photodiode, the higher the spectral sensitivity. An increase in the spectral sensitivity leads to an increase in light sensitivity of the image sensor to external light, giving the image sensor favorable properties. However, there are many factors that can reduce the spectral sensitivity of the image sensor, such as the configuration of the image sensor, the wavelengths of incident light, etc. For example, many specific elements of an image sensor, such as its lines, can prevent light from being freely incident. Also, the amount of light absorbed by the photodiode can be reduced according to the wavelength of the light. For example, with a longer wavelength, light penetration through the photodiode increases. Thus, regions of light with a long wavelength (in the red spectrum, for example) are likely not to be absorbed completely by the photodiode, thus reducing the spectral sensitivity.

SUMMARY OF THE INVENTION

In accordance with aspects of the present invention, there is provided an image sensor with an increased spectral sensitivity.

In accordance with aspects of the present invention also provided is an image sensor capable of minimizing interference between neighboring pixels, and to a method of forming the image sensor.

In accordance with one aspect of the present invention provided is an image sensors including: a pixel semiconductor pattern disposed on a substrate; an interlayer insulating layer interposed between the pixel semiconductor pattern and the substrate; a photodiode in the pixel semiconductor pattern; a base multi-layered reflection layer interposed between the photodiode and the interlayer insulating layer; and a sidewall multi-layered reflection layer disposed on a sidewall of the pixel semiconductor pattern.

The sidewall multi-layered reflection layer can include a plurality of layers having different refractive indexes with respect to each other. One layer of the sidewall multi-layered reflection layer that contacts the sidewall of the pixel semiconductor pattern can have a refractive index different from a refractive index of the pixel semiconductor pattern.

The sidewall multi-layered reflection layer can include a first sidewall reflection layer and a second sidewall reflection layer that are stacked on the sidewall of the pixel semiconductor pattern. The first sidewall reflection layer can have a refractive index that is lower than refractive indexes of the second sidewall reflection layer and the pixel semiconductor pattern, and a layer of the sidewall multi-layered reflection layer contacting the pixel semiconductor pattern can be the first sidewall reflection layer.

The first sidewall reflection layer and the second sidewall reflection layer of the sidewall multi-layered reflection layer can be alternatingly stacked a plurality of times on the sidewall of the pixel semiconductor pattern.

The first sidewall reflection layer can be one of a silicon oxide layer and a layer of air, and the second sidewall reflection layer can be formed of silicon.

The layers of the sidewall multi-layered reflection layer can have thicknesses chosen based on the sidewall of the pixel semiconductor pattern, and for inducing constructive interference of light reflected by at least one boundary in the sidewall multi-layered reflection layer and a boundary between the sidewall multi-layered reflection layer and the pixel semiconductor pattern.

A plurality of the pixel semiconductor pattern can be provided in a two-dimensional layout of columns and rows on the substrate. Here, the sidewall multi-layered reflection layer can be disposed between a pair of adjacent pixel semiconductor patterns, and layers of sidewall multi-layered reflection layer that contact the pair of adjacent pixel semiconductor patterns can be first reflection layers.

The base multi-layered reflection layer can include a plurality of layers with different refractive indexes relative to each other. A refractive index of a layer of the base multi-layered reflection layer that contacts the pixel semiconductor pattern can be different from a refractive index of the pixel semiconductor pattern.

The base multi-layered reflection layer can further include a first base reflection layer and a second base reflection layer that are stacked. Here, the first base reflection layer can have a refractive index that is lower than refractive indexes of the second base reflection layer and the pixel semiconductor pattern. A layer of the base multi-layered reflection layer that contacts the pixel semiconductor pattern can be the first base reflection layer. The first and second base reflection layers can be alternatingly stacked at least once.

The layers of the base multi-layered reflection layer can have thicknesses that induce constructive interference of light reflected by at least one boundary of the base multi-layered reflection layer and a boundary between the base multi-layered reflection layer and the pixel semiconductor pattern.

The image sensor can further include: a color filter covering the pixel semiconductor pattern; and a micro lens disposed on the color filter and covering the photodiode, wherein the pixel semiconductor pattern is disposed between the color filter and the substrate.

In accordance with another aspect of the invention, provided is an image sensor comprising: a pixel semiconductor pattern disposed on a substrate; an interlayer insulating layer interposed between the pixel semiconductor pattern and the substrate; a photodiode in the pixel semiconductor pattern; a base multi-layered reflection layer interposed between the photodiode and the interlayer insulating layer; and a sidewall multi-layered reflection layer disposed on a sidewall of the pixel semiconductor pattern. The sidewall multi-layered reflection layer includes a plurality of layers having different refractive indexes with respect to each other, wherein one layer of the sidewall multi-layered reflection layer that contacts the sidewall of the pixel semiconductor pattern has a refractive index different from a refractive index of the pixel semiconductor pattern. The image sensor further includes: a color filter covering the pixel semiconductor pattern; and a micro lens disposed on the color filter and covering the photodiode, wherein the pixel semiconductor pattern is disposed between the color filter and the substrate.

The base multi-layered reflection layer can include a plurality of layers with different refractive indexes relative to each other, and a refractive index of a layer of the base multi-layered reflection layer that contacts the pixel semiconductor pattern is different from a refractive index of the pixel semiconductor pattern.

A plurality of the pixel semiconductor pattern can be provided in a two-dimensional layout of columns and rows on the substrate. Here, the sidewall multi-layered reflection layer can be disposed between a pair of adjacent pixel semiconductor patterns, and layers of sidewall multi-layered reflection layer that contact the pair of adjacent pixel semiconductor patterns can be first reflection layers.

In accordance with another aspect of the present invention, provide is a method for forming an image sensor, including: forming a photodiode in a semiconductor layer included in a first substrate; forming a base multi-layered reflection layer covering the photodiode; forming an interlayer insulating layer covering the semiconductor layer, with the base multi-layered reflection layer interposed therebetween; bonding the interlayer insulating layer and a second substrate; removing the first substrate with the exception of the semiconductor layer; and forming a sidewall multi-layered reflection layer in the semiconductor layer to define a pixel semiconductor pattern containing the photodiode. The pixel semiconductor pattern is a portion of the semiconductor layer enclosed by the sidewall multi-layered reflection layer.

The sidewall multi-layered reflection layer can include a plurality of layers having different refractive indexes with respect to each other, and a layer contacting a sidewall of the pixel semiconductor pattern within the sidewall multi-layered reflection layer can have a refractive index different from a refractive index of the pixel semiconductor pattern.

Thicknesses of the layers in the sidewall multi-layered reflection layer can be controlled based on the sidewall of the pixel semiconductor pattern, for inducing constructive interference of light reflected by at least one boundary in the sidewall multi-layered reflection layer and a boundary between the sidewall multi-layered reflection layer and the pixel semiconductor pattern.

Forming the sidewall multi-layered reflection layer can be performed after the first substrate, with the exception of the semiconductor layer, is removed.

The forming of the sidewall multi-layered reflection layer can be performed before the forming of the base multi-layered reflection layer.

The forming of the sidewall multi-layered reflection layer can include forming a plurality of grooves for defining the pixel semiconductor pattern through selectively etching the semiconductor layer. Here, the grooves can surround the pixel semiconductor pattern in layers, and a material filling the grooves and a portion of the semiconductor layer between the grooves can be included in the sidewall multi-layered reflection layer.

The material filling the grooves can have a lower refractive index than the semiconductor layer.

The material filling the grooves can be one of silicon oxide and air.

The forming of the sidewall multi-layered reflection layer can include: forming a groove defining the pixel semiconductor pattern by selectively etching the semiconductor layer; forming a first sidewall reflection layer to be conformal with inner sidewalls and a floor of the groove; and forming a second sidewall reflection layer within the groove and on the first sidewall reflection layer.

The second sidewall reflection layer can be formed to be conformal within the groove on the first sidewall reflection layer. In this case, the first and second sidewall reflection layers can be alternatingly formed a plurality of times.

The first sidewall reflection layer can have a refractive index lower than refractive indexes of the second sidewall reflection layer and the semiconductor layer. Here, the first sidewall reflection layer can contact a sidewall of the pixel semiconductor pattern.

The base multi-layered reflection layer can include a plurality of layers having different refractive indexes with respect to each other. A refractive index of a layer contacting the pixel semiconductor pattern within the base multi-layered reflection layer can be different from a refractive index of the pixel semiconductor pattern.

The base multi-layered reflection layer can include a first base reflection layer and a second base reflection layer stacked in sequence on the photodiode disposed on the first substrate. The first base multi-layered reflection layer can have a refractive index lower than refractive indexes of the second base reflection layer and the pixel semiconductor pattern. A layer of the base multi-layered reflection layer contacting the pixel semiconductor pattern can be the first base reflection layer. In this case, the first and second base reflection layers can be alternately formed at least once.

The layers of the base multi-layered reflection layer can be controlled in thickness, for inducing constructive interference of light reflected by at least one boundary in the base multi-layered reflection layer and a boundary between the base multi-layered reflection layer and the pixel semiconductor pattern.

After the removing of the first substrate, with the exception of the semiconductor layer, the method can further include: forming a color filter covering the photodiode; and forming a micro lens on the color filter. The pixel semiconductor pattern can be disposed between the color filter and the interlayer insulating layer bonded to the second substrate.

BRIEF DESCRIPTION OF THE FIGURES

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the figures.

DETAILED DESCRIPTION OF PREFERRED EMBODIMENTS

Figure 1:
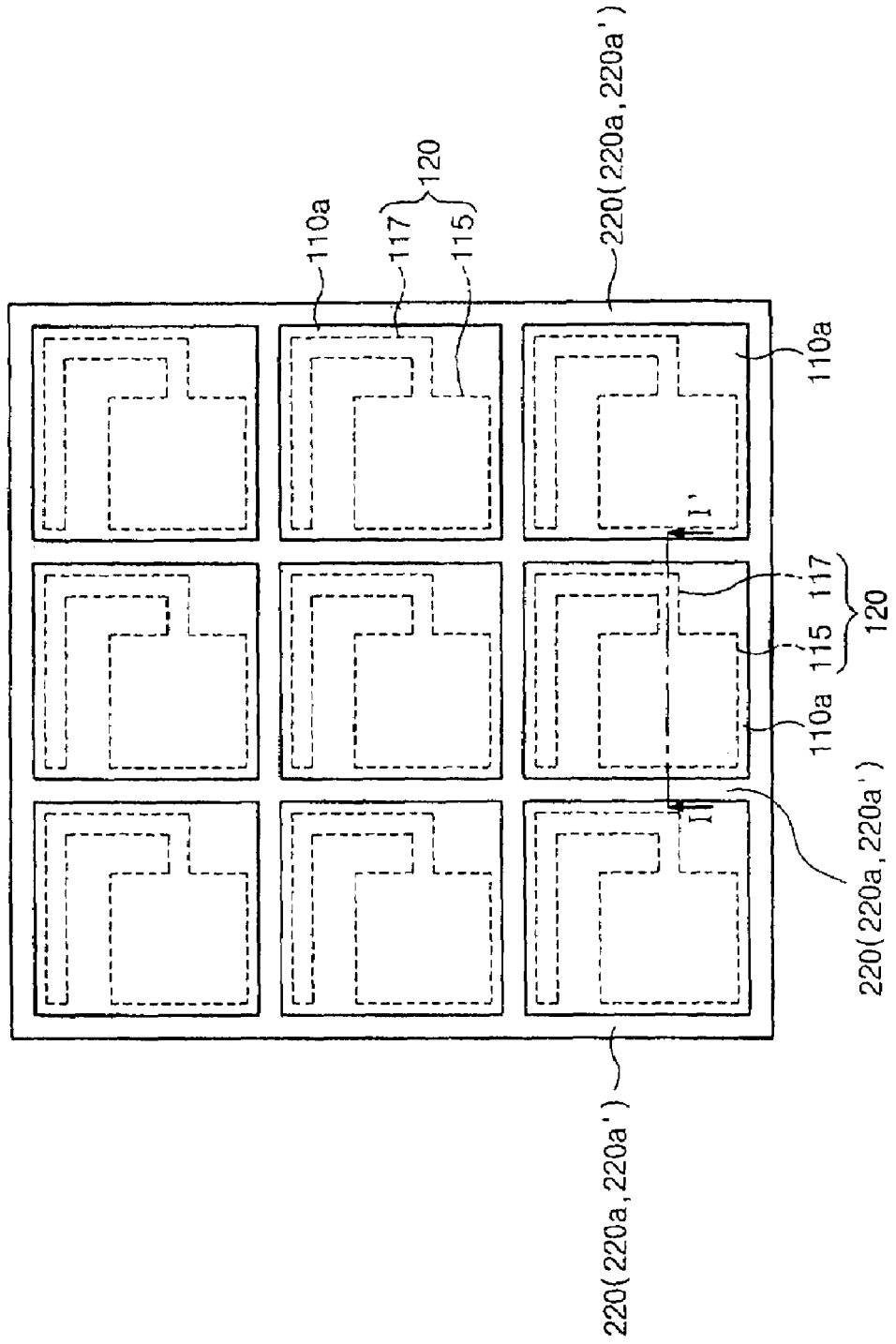
FIG. 1 is a plan view of an image sensor according to aspects of the present invention.

Embodiments demonstrating various aspects of the present invention will be described below in more detail with reference to the accompanying drawings. The present invention can, however, be embodied in different forms and should not be constructed as limited to the embodiments set forth herein.

In the figures, the dimensions of layers and regions are exaggerated for clarity of illustration. It will also be understood that when a layer (or film) is referred to as being 'on' another layer or substrate, it can be directly on the other layer or substrate, or intervening layers can also be present. Further, it will be understood that when a layer is referred to as being 'under' another layer, it can be directly under, and one or more intervening layers can also be present. In addition, it will also be understood that when a layer is referred to as being 'between' two layers, it can be the only layer between the two layers, or one or more intervening layers can also be present. Like reference numerals refer to like elements throughout.

Hereinafter, an exemplary embodiment in accordance with aspects of the present invention will be described with reference to the accompanying drawings.

Figure 2:
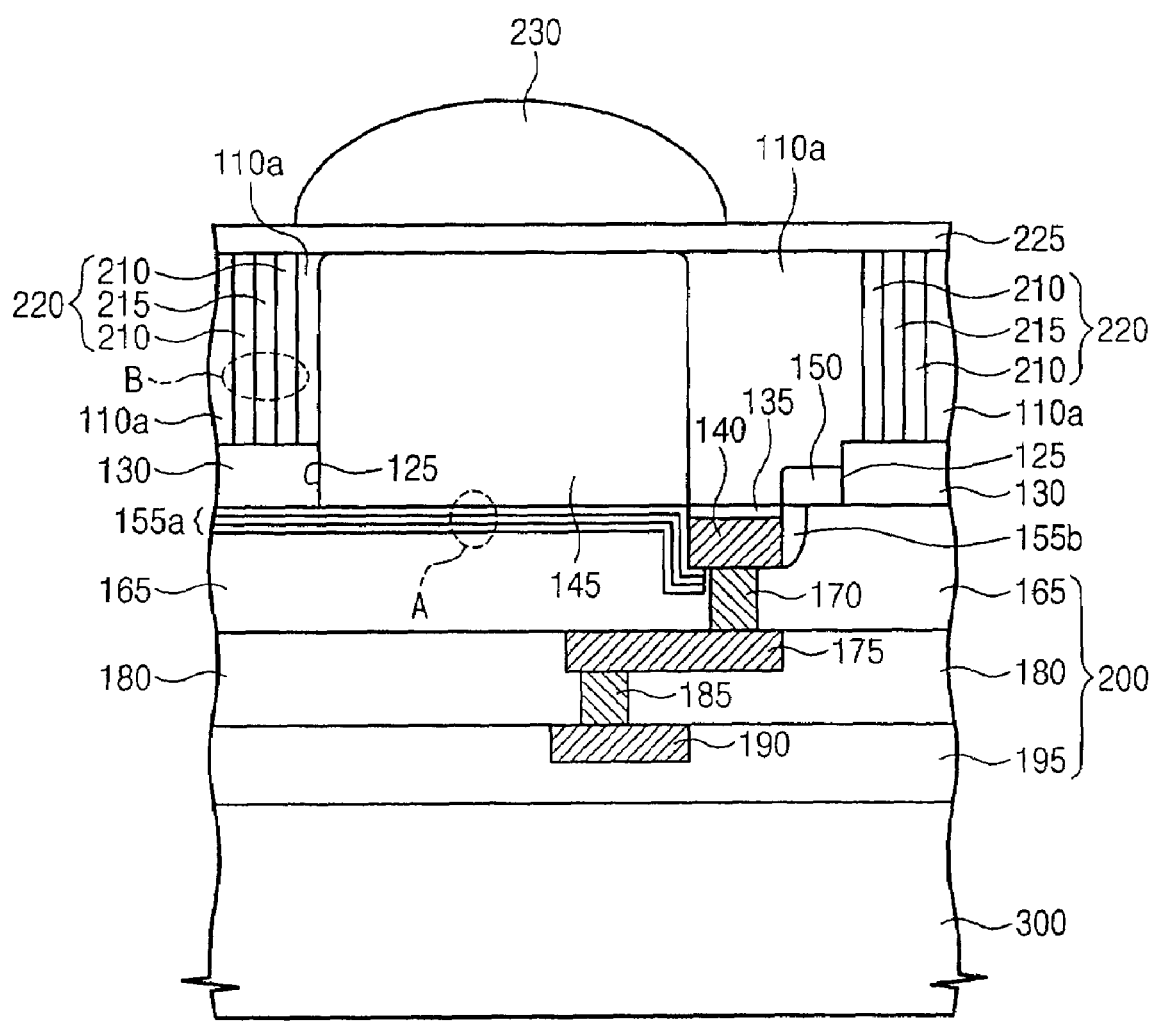
FIG. 2 is a sectional view of FIG. 1 taken along line I-I' for describing an embodiment of an image sensor according to aspects of the present invention.

FIG. 1 is a plan view of an image sensor according to aspects of the present invention, and FIG. 2 is a sectional view of FIG. 1 taken along line I-I' for describing an embodiment of an image sensor according to aspects of the present invention.

Referring to FIGS. 1 and 2, a plurality of pixel semiconductor patterns 110a can be arranged two-dimensionally in rows and columns on a substrate 300. The pixel semiconductor patterns 110a are formed as a semiconductor. In particular, the pixel semiconductor patterns 110a can be formed of silicon. Each pixel semiconductor pattern 110a has a photodiode 145 disposed therein. The pixel semiconductor patterns 110a are doped with a first conductive dopant. The photodiodes 145 are regions doped with a second conductive dopant. That is, a photodiode 145 is a region doped with the second conductive dopant within a predetermined region of a pixel semiconductor pattern 110a. The first conductive dopant can be a P-type dopant, and the second conductive dopant can be an N-type dopant. Conversely, the first conductive dopant can be an N-type dopant, and the second conductive dopant may be a P-type dopant. However, in embodiments herein, descriptions are given of the first conductive dopant being a P-type dopant and the second conductive dopant being an N-type dopant. Therefore, the photodiodes 145 form a PN junction with the pixel semiconductor pattern 110a. The photodiodes 145 are doped at a low concentration, so that most or the entirety of the photodiodes 145 become depletion regions.

A sidewall multi-layered reflection layer 220 is provided between the side walls of the pixel semiconductor patterns 110a. The sidewall multi-layered reflection layer 220 includes a plurality of layers sequentially stacked at the side walls of the pixel semiconductor patterns 110a. Here, the sidewall multi-layered reflection layer 220 includes layers with different respective refractive indexes. A detailed description of the sidewall multi-layered reflection layer 220 will be provided below. The sidewall multi-layered reflection layer 220 encloses the side walls of the pixel semiconductor patterns 110a. As shown, the sidewall multi-layered reflection layer 220 can be disposed between all of the pixel semiconductor patterns 110a. That is, the sidewall multi-layered reflection layer 220 can be disposed along the boundaries of all of the pixel semiconductor patterns 110a, and all of the pixel semiconductor patterns 110a can thus be separated by the sidewall multi-layered reflection layer 220.

Alternatively, the sidewall multi-layered reflection layer 220 can enclose the side walls of a portion of the pixel semiconductor patterns 110a from the pixel semiconductor patterns 110a. In this case, those from the pixel semiconductor patterns 110a that are not selected may be extended and connected to adjacent pixel semiconductor patterns 110a. Here, the selected pixel semiconductor patterns 110a can be included in pixels that receive light of long wavelengths (for example, red light) and convert it to electrical signals. In the embodiments below, all of the side walls of the pixel semiconductor patterns 110a will be described as enclosed by the sidewall multi-layered reflection layer 220, as shown in FIG. 1.

The pixel semiconductor patterns 110a have first and second surfaces in parallel, i.e., that face one another. Here, the first surface of a pixel semiconductor pattern 110a is more proximate to the substrate 300 than is the second surface. A device isolation pattern 130 that separates an active region 120 is disposed on the first surface of the pixel semiconductor pattern 110a. The device isolation pattern 130 can be in a shape that fills a trench 125 formed on the first surface of the pixel semiconductor pattern 110a. The pixel isolation pattern 130 also has a first surface and a second surface in parallel, i.e., that face one another. The first surface of the device isolation pattern 130 is more proximate to the substrate 300 than is the second surface. The second surface of the device isolation pattern 130 can be below the second surface of the pixel semiconductor pattern 110a. That is, the thickness of the pixel semiconductor pattern 110a is greater than the depth of the trench 125 with respect to the first surface of the pixel semiconductor pattern 110a.

The active region 120 can be divided into a first section 115 and a second section 117. The first section 115 of the active region 120 is a section in which the photodiode 145 is formed, and the second section 117 of the active region 120 is a section in which at least one MOS transistor is formed. The second section 117 of the active region 120 is connected to one side of the first section 115 of the active region 120. The photodiode 145 also has a first surface and a second surface that face each other. Here, the first surface of the photodiode 145 is coplanar with the first surface of the pixel substrate pattern 110a. As shown in FIG. 2, the second surface of the photodiode 145 can share a common surface with the second surface of the pixel substrate pattern 110a. Alternatively, the second surface of the photodiode 145 can be lower than the second surface of the pixel semiconductor pattern 110a. That is, the thickness of the photodiode 145 can be less than the thickness of the pixel semiconductor pattern 110a.

An interlayer insulating layer 200 is interposed between the pixel semiconductor pattern 110a and the substrate 300. The interlayer insulating layer 200 can be formed of multiple insulating layers 165, 180, and 195. A gate electrode 140 is disposed between the interlayer insulating layer 200 and the pixel semiconductor pattern 110a. The gate electrode 140 is disposed between the interlayer insulating layer 200 and the active region 120. The gate electrode 140 can be interposed between the second section 117 proximate to the first section 115 and the interlayer insulating layer 200. A gate insulating layer 135 is interposed between the gate electrode 140 and the active region 120. The gate insulating layer 135 can be formed of an oxide layer—preferably a thermal oxide layer. The gate electrode 140 is formed of a conductive material. For example, the gate electrode 140 can include at least one material selected from a group comprising a doped semiconductor, a metal (i.e., tungsten or molybdenum), a conductive metal nitride (i.e., titanium nitride or tantalum nitride), and a metal silicide (i.e., tungsten silicide or cobalt silicide). In the drawings, one gate electrode 140 is shown. Alternatively, when pixels of an image sensor require a plurality of MOS transistors, a plurality of gate electrodes can be separately arranged between the pixel semiconductor patterns 110a and the interlayer insulating layer 200. The plurality of gate electrodes is arranged between the interlayer insulating layer 200 and the second section 117 of the active region 120. The gate electrode 140 has a first surface and a second surface facing each other. Here, the first surface of the gate electrode 140 is proximate to the pixel semiconductor pattern 110a.

A floating doped region 150 is disposed within the second section 117 of the active region 120 on one side of the gate electrode 140. The floating doped region 150 is doped with a dopant of the second conductive type. The floating doped region 150 and the photodiode 145 are separated from each other. The floating doped region 150 has a first surface and a second surface facing each other. The first surface of the floating doped region 150 shares the same surface with the first surface of the pixel semiconductor pattern 110a. The second surface of the floating doped region 150 is lower than the second surface of the photodiode 145.

A base multi-layered reflection layer 155a is interposed between the photodiode 145 and the interlayer insulating layer 200. The base multi-layered reflection layer 155a can be extended to cover a side wall of the gate electrode 140. Furthermore, the base multi-layered reflection layer 155a can be further extended to cover a portion of the second surface of the gate electrode 140. A gate spacer 155b can be disposed on another side wall of the gate electrode 140 proximate to the floating doped region 150. The gate spacer 155b can include the same material as the base multi-layered reflection layer 155a. A detailed description of the base multi-layered reflection layer 155a will henceforth be given.

As described above, the interlayer insulating layer 200 includes a plurality of insulating layers 165, 180, and 195. Here, the closest insulating layer 165 to the pixel semiconductor pattern 110a will be referred to as a first insulating layer 165, and the insulating layers 180 and 195 in sequence below the first insulating layer 165 will be referred to respectively as the second insulating layer 180 and the third insulating layer 195. A first line 175 is disposed between the first insulating layer 165 and the second insulating layer 180, and a first contact plug 170 passes through the first insulating layer 165 and connects the gate electrode 140 to the first line 175. A second line 190 is interposed between the second insulating layer 180 and the third insulating layer 195, and a second contact plug 185 passes through the second insulating layer 180 and connects the second line 190 to the first line 175. While a description of the lines 175 and 190 of the second layer and the interlayer insulating layer 200, including the three insulating layers 165, 180, and 195, according to embodiments of the present invention has been provided, the number of layers of lines required by an image sensor can be different. Accordingly, the number of insulating layers that comprise the interlayer insulating layer 200 can be different. Also, the interlayer insulating layer 200 can include other layers that perform other functions. The lines 175 and 190 and the contact plugs 170 and 185 are formed of a conductive material. The insulating layers 165, 180, and 195 can be formed of oxide layers, for example.

A color filter 225 is disposed on the second surface of the pixel semiconductor pattern 110a, and a micro lens 230 that covers the photodiode 145 is disposed on the color filter 225. External light passes through the micro lens 230 and the color filter 225, and is incident on the second surface of the photodiode 145.

Next, a detailed description of embodiments will be given of the base multi-layered reflection layer 155a and the sidewall multi-layered reflection layer 220, with reference to FIGS. 3 and 4. First, the base multi-layered reflection layer 155a will be described.

Figure 3:
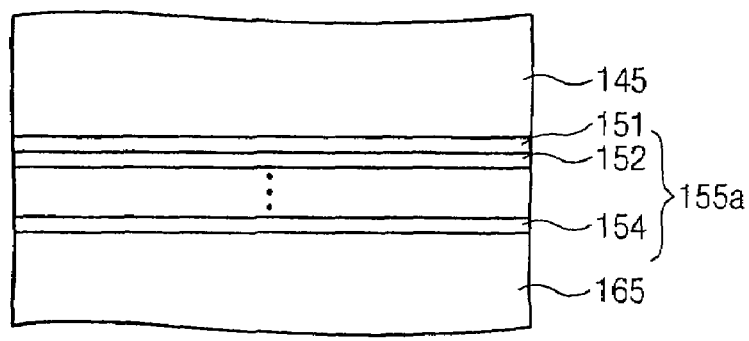
FIG. 3 is an enlarged view of section A in FIG. 2 for describing an embodiment of a base multi-layered reflection layer included in an image sensor according to aspects of the present invention.

FIG. 3 is an enlarged view of section A in FIG. 2 for describing an embodiment of a base multi-layered reflection layer included in an image sensor according to aspects of the present invention.

Referring to FIGS. 1, 2, and 3, the base multi-layered reflection layer 155a contacts the first surface of the pixel semiconductor pattern 110a on which the photodiode 145 is formed. The base multi-layered reflection layer 155a includes at least two stacked layers having different refractive indexes. Also, layers within the base multi-layered reflection layer 155a that contact the photodiode 145 have different refractive indexes to those of the pixel semiconductor patterns 110a.

The base multi-layered reflection layer 155a can include a first base multi-layered reflection layer 151 and a second base multi-layered reflection layer 152. The refractive index of the first base multi-layered reflection layer 151 is different from the refractive indexes of the second base multi-layered reflection layer 152 and the pixel semiconductor pattern 110a. Here, the layer of the base multi-layered reflection layer 155a that contacts the pixel semiconductor pattern 110a can be the first base multi-layered reflection layer 151. The reflective index of the first base multi-layered reflection layer 151 can be lower than the reflective indexes of the second base multi-layered reflection layer 152 and the pixel semiconductor pattern 110a. The first and second base multi-layered reflection layers 151 and 152 can be stacked in alternation at least once. In other words, the base multi-layered reflection layer 155a can include the first and second base multi-layered reflection layers 151 and 152 alternately stacked a plurality of times. The layer 154 contacting the interlayer insulating layer 200 of the base multi-layered reflection layer 155a can be the first base multi-layered reflection layer 151 or the second base multi-layered reflection layer 152.

The difference in refractive indexes of the pixel semiconductor pattern 110a and the first base multi-layered reflection layer 151 contacting the pixel semiconductor pattern 110a can be substantial. In this case, external light is reflected at a high rate by a boundary surface (hereinafter referred to as the first boundary surface) between the pixel semiconductor pattern 110a and the base multi-layered reflection layer 155a.

Also, the base multi-layered reflection layer 155a has at least two layers with different refractive indexes. Thus, at least one boundary surface reflecting light is disposed in the base multi-layered reflection layer 155a. Hereinafter, the boundary surface in the base multi-layered reflection layer 155a is defined as the second boundary surface. Therefore, external light incident on the second surface of the photodiode 145 is reflected by the first boundary surface and at least one second boundary surface within the base multi-layered reflection layer 155a. The light reflected by the first and second boundary surfaces is incident again on the photodiode 145. As a result, the rate at which the external light is absorbed by the photodiode 145 is increased to increase the light sensitivity of the image sensor.

To allow for constructive interference of light reflected by the first boundary surface and the second boundary surface within the base multi-layered reflection layer 155a, the thicknesses of the layers in the base multi-layered reflection layer 155a can be adjusted. There are many causes for constructive interference of light reflected by the first and second boundary surfaces. Examples can include refractive indexes of the first and second base multi-layered reflection layers 151 and 152, wavelengths of external light, and/or the number of layers in the base multi-layered reflection layer 155a.

With the first and second base multi-layered reflection layers 151 and 152 alternately stacked three times, the first and second base multi-layered reflection layers 151 and 152 respectively formed of silicon oxide (with a refractive index of approximately 1.46) and silicon (with a refractive index of approximately 4), the pixel semiconductor pattern 110a also being silicon, and the external light having a long red-colored wavelength, the first floating reflective layer 151 can be approximately 800 Å, and the second floating reflective layer 152 can be approximately 400 Å.

Next, the sidewall multi-layered reflection layer 220 will be described with reference to FIG. 4.

Figure 4:
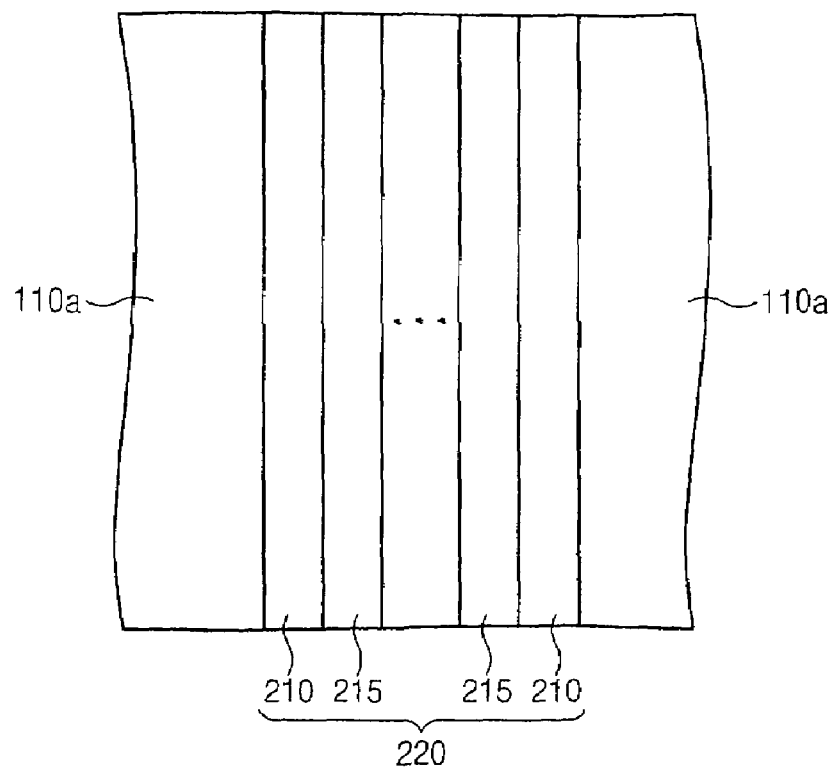
FIG. 4 is an enlarged view of section B in FIG. 2 for describing an embodiment of a sidewall multi-layered reflection layer included in an image sensor according to aspects of the present invention.

FIG. 4 is an enlarged view of section B in FIG. 2 for describing an embodiment of a sidewall multi-layered reflection layer included in an image sensor according to aspects of the present invention.

Referring to FIGS. 1, 2, 3, and 4, the sidewall multi-layered reflection layer 220 is disposed between the side walls of the pixel semiconductor patterns 110a. The sidewall multi-layered reflection layer 220 can contact the side walls of the pixel semiconductor patterns 110a. The boundary surface between the sidewall multi-layered reflection layer 220 and the pixel semiconductor pattern 110a will hereinafter be referred to as the third boundary surface. The layer contacting the side wall of the pixel semiconductor pattern 110a within the sidewall multi-layered reflection layer 220 can have a refractive index different from that of the pixel semiconductor pattern 110a. The sidewall multi-layered reflection layer 220 includes layers with different respective refractive indexes. That is, at least one boundary surface is present within the sidewall multi-layered reflection layer 220. The boundary surface within the sidewall multi-layered reflection layer 220 will hereinafter be referred to as the fourth boundary layer.

The sidewall multi-layered reflection layer 220 includes a first sidewall reflection layer 210 and a second sidewall reflection layer 215. The refractive index of the first sidewall reflection layer 210 is different from the refractive indexes of the pixel semiconductor pattern 110a and the second sidewall reflection layer 215. In particular, the refractive index of the first sidewall reflection layer 210 can be lower than the refractive indexes of the pixel semiconductor pattern 110a and the second sidewall reflection layer 215. The layer of the sidewall multi-layered reflection layer 220 that contacts the pixel semiconductor pattern 110a can be the first sidewall reflection layer 210. The first sidewall reflection layer 210 can be a silicon oxide layer or a layer of air (with a refractive index of 1). The second sidewall reflection layer 215 can be a silicon layer.

The sidewall multi-layered reflection layer 220 includes a structure in which the first and second sidewall reflection layers 210 and 215 are stacked in an alternating manner a plurality of times on the side wall of the pixel semiconductor pattern 110a. The sidewall multi-layered reflection layer 220 is interposed between a pair of neighboring pixel semiconductor patterns 110a. Here, either side wall of the sidewall multi-layered reflection layer 220 contacts the neighboring pixel semiconductor pattern 110a. Both the layers of the sidewall multi-layered reflection layer 220 contacting the pair of neighboring pixel semiconductor patterns 110a can be the first sidewall reflection layer 210. Thus, the occurrence of interference between neighboring pixels can be minimized.

The sidewall multi-layered reflection layer 220 minimizes incidence of the light (reflected by the base multi-layered reflection layer 155a at the first and second boundary surfaces) on the photodiode 145 within another pixel semiconductor pattern 110a. In other words, the sidewall multi-layered reflection layer 220 minimizes incidence of the light incident on a photodiode 145 that it encloses being incident on other pixels. Therefore, interference of the image sensor can be minimized, and image distortion can be minimized.

Light that is reflected from the first and second boundary surfaces is also reflected by the third boundary surface and also the fourth boundary surface within the sidewall multi-layered reflection layer 220. As a result, the portion of the light reflected toward the sidewall multi-layered reflection layer 220 from the light reflected by the first and second boundary surfaces is incident again on the photodiode 145, so that the absorption efficiency of external light is increased. Also, as described above, incidence of light reflected by the first and second boundary surfaces on neighboring pixels can be minimized. Therefore, interference between neighboring pixels of the image sensor can be minimized, and image distortion of the image sensor can be minimized.

The thicknesses of the layers of the sidewall multi-layered reflection layer 220 can be adjusted to induce constructive interference of light reflected by the third boundary surface and by the fourth boundary surface. Here, the thicknesses of the layers within the sidewall multi-layered reflection layer 220 are based on the side walls of the pixel semiconductor patterns 110a.

For example, with the sidewall multi-layered reflection layer 220 having a second sidewall reflection layer 215 interposed between two first sidewall reflection layers 210, the first and second sidewall reflection layers 210 and 215 respectively formed of a silicon oxide layer and a silicon layer, and an external light being a red light with a long wavelength, the thicknesses of the first and second sidewall reflection layers 210 and 215 can be around 550 Å and 500 Å, respectively.

In the above-described example, when the first sidewall reflection layer 210 is a layer of air, and the second sidewall reflection layer 215 is a silicon layer, the thicknesses of the first and second sidewall reflection layers 210 and 215 can be around 740 Å and 520 Å, respectively.

As shown, the sidewall multi-layered reflection layer 220 can contact the device isolation pattern 130. Also, the sidewall multi-layered reflection layer 220 can share the same surface as the second surface of the pixel semiconductor pattern 110a.

Alternatively, while sharing a common surface with the second surface of the pixel semiconductor pattern, the sidewall multi-layered reflection layer 220 110a, can be separated from the device isolation pattern 130. The neighboring pixel semiconductor patterns 110a, in this case, can extend between and connect the sidewall multi-layered reflection layer 220 and the device isolation pattern 130.

In another alternative embodiment, the sidewall multi-layered reflective layer 220 can contact the device isolation pattern 130, and can have a side lower than the two sides of the pixel semiconductor pattern 110a. In this case, the portions of the neighboring pixel semiconductor patterns 110a that are higher than the sidewall multi-layered reflection layer 220 can extend sideways and connect together.

Next, a portion of the sidewall multi-layered reflection layer 220 can adopt a different form, which will be described with reference to the drawings. Like elements in the present embodiment use like reference numerals.

Figure 5:
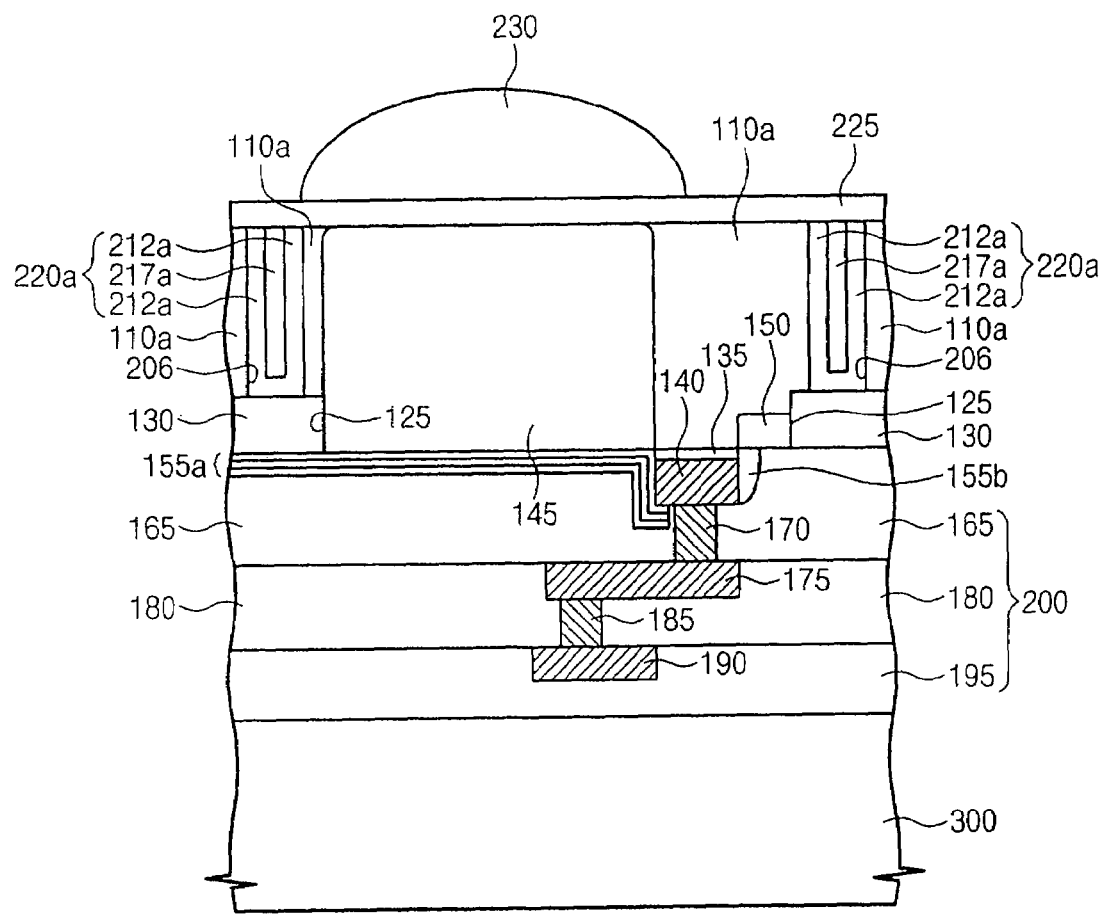
FIG. 5 is a sectional view of FIG. 1 taken along line I-I' for illustrating another embodiment of an image sensor according to aspects of the present invention.

FIG. 5 is a sectional view of FIG. 1 taken along line I-I' for illustrating another embodiment of an image sensor according to aspects of the present invention.

Referring to FIG. 5, a sidewall multi-layered reflection layer 220a can be disposed within a groove 206 formed between pixel semiconductor patterns 110a. The sidewall multi-layered reflection layer 220a includes a first sidewall reflection layer 212a and a second sidewall reflection layer 217a having different refractive indexes. The first sidewall reflection layer 212a has a refractive index different from that of a pixel semiconductor pattern 110a. In particular, the first sidewall reflection layer 212a can have a lower refractive index than the pixel semiconductor pattern 110a and the second sidewall reflection layer 217a. The first sidewall reflection layer 212a is substantially conformal to both side surfaces of the groove 206 and the surface of the groove 206 proximate to a device isolation pattern 130. The second sidewall reflection layer 217a is disposed within the groove 206 and on the first sidewall reflection layer 212a. The first sidewall reflection layer 212a contacts both sides of the groove 206 (that is, the side walls of a pair of neighboring pixel semiconductor patterns), and the second sidewall reflection layer 217a contacts the first sidewall reflection layer 212a. The surface of the groove 206 neighboring the device isolation pattern 130 can either contact the device isolation pattern 130 or be separate from the device isolation pattern 130.

The second sidewall reflection layer 217a is disposed on the first sidewall reflection layer 212a, and can also be substantially conformal to both side surfaces of the groove 206 and the surface of the groove 206 proximate to a device isolation pattern 130. In this case, the first and second sidewall reflection layers 212a and 217a can be alternatingly disposed at least once. Here, the sidewall multi-layered reflection layer 220a can be disposed on a sidewall of the pixel semiconductor pattern 110a in an odd 5-layer or higher configuration.

In the present alternate embodiment, the first sidewall reflection layer 212a can be formed of a silicon oxide layer, and the second sidewall reflection layer 217a can be formed of a silicon layer.

Next, a description will be given of another embodiment of a sidewall multi-layered reflection layer according to aspects of the present invention. Like elements in the present embodiment use like reference numerals.

Figure 6:
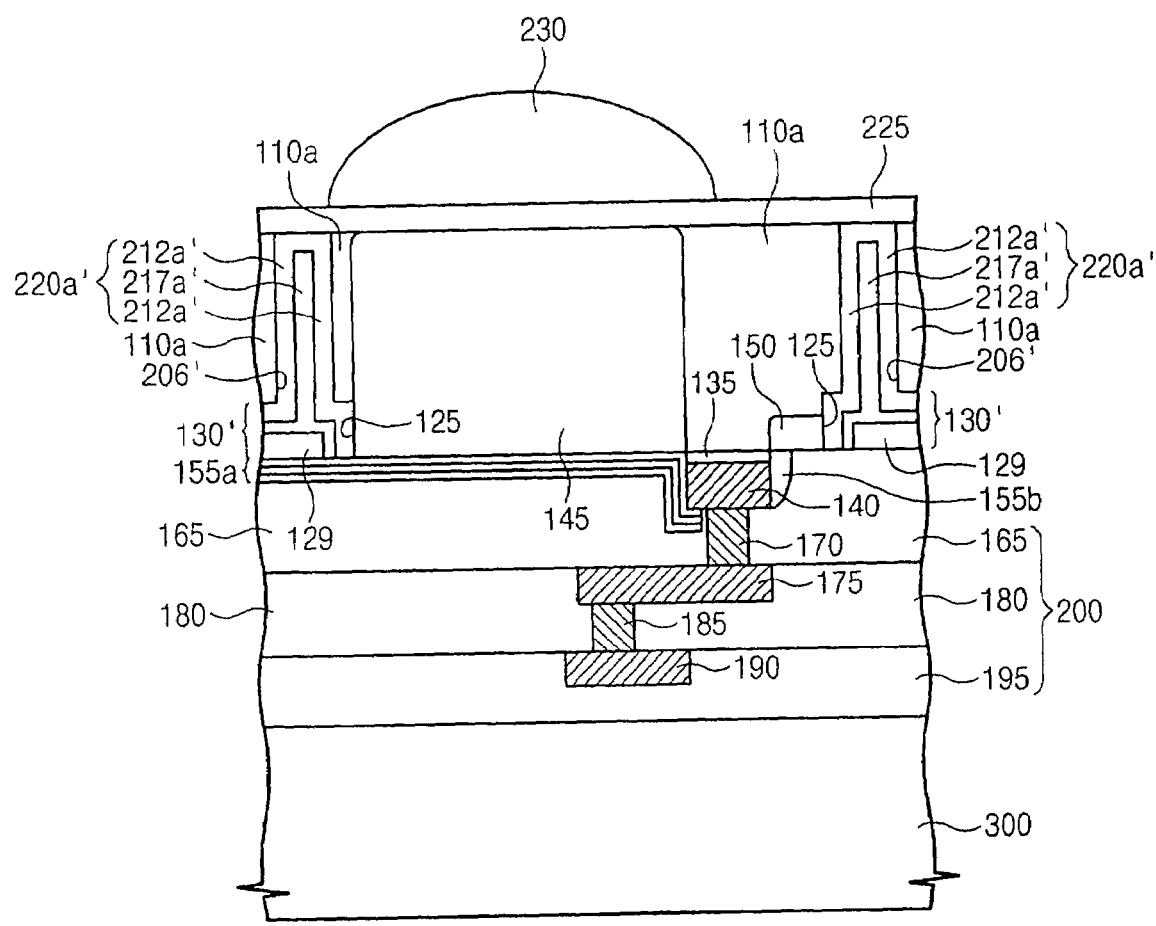
FIG. 6 is a sectional view of FIG. 1 taken along line I-I' for describing an alternate embodiment of an image sensor according to aspects of the present invention.
Figure 7:
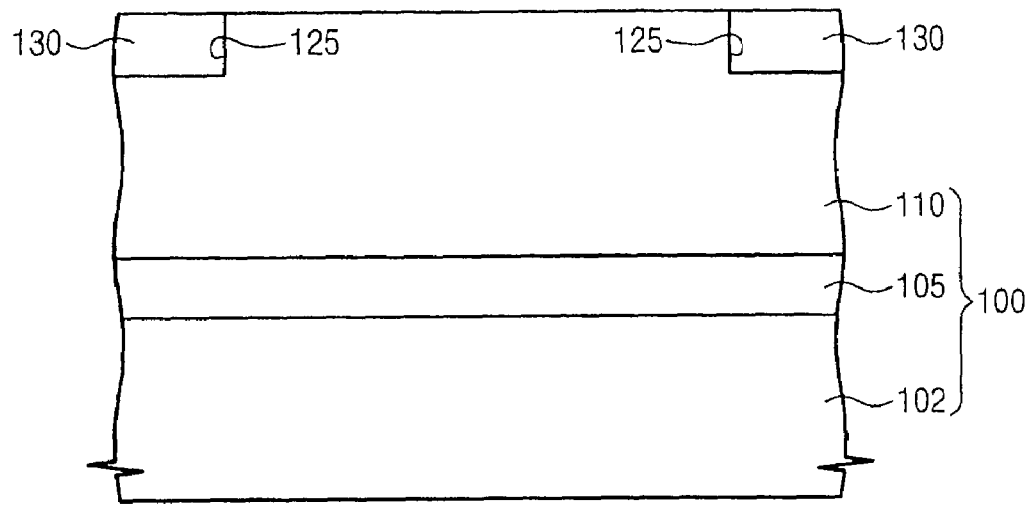
FIGS. 7 through 14 are sectional views showing an embodiment of a method of forming an image sensor according to aspects of the present invention.
Figure 8:
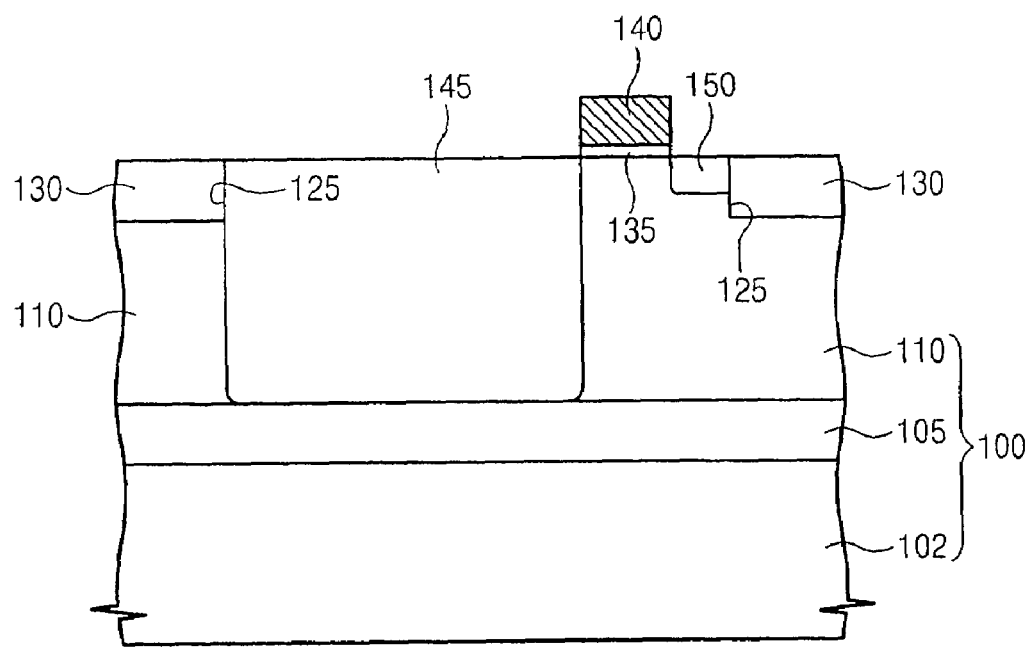
Figure 9:
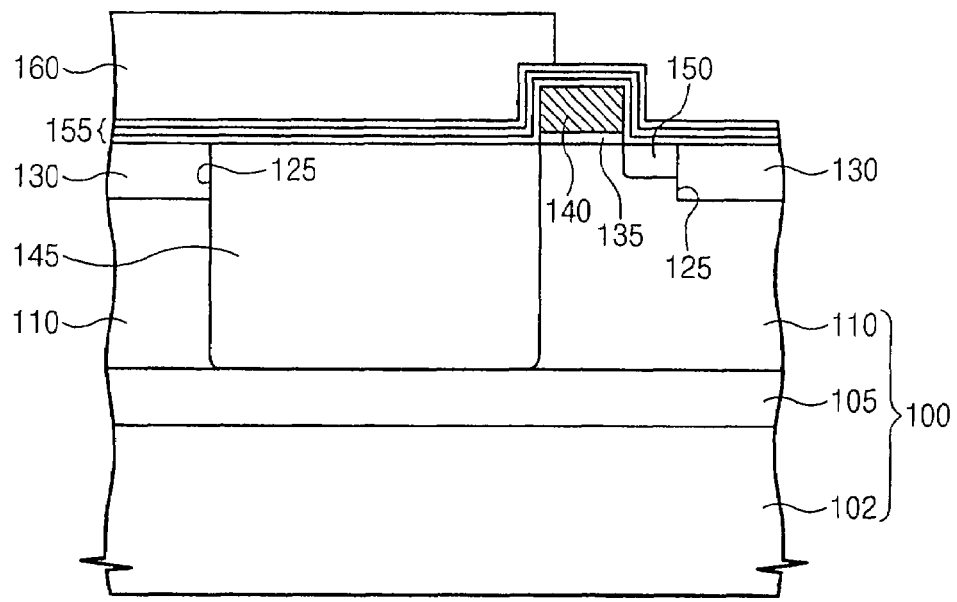
Figure 10:
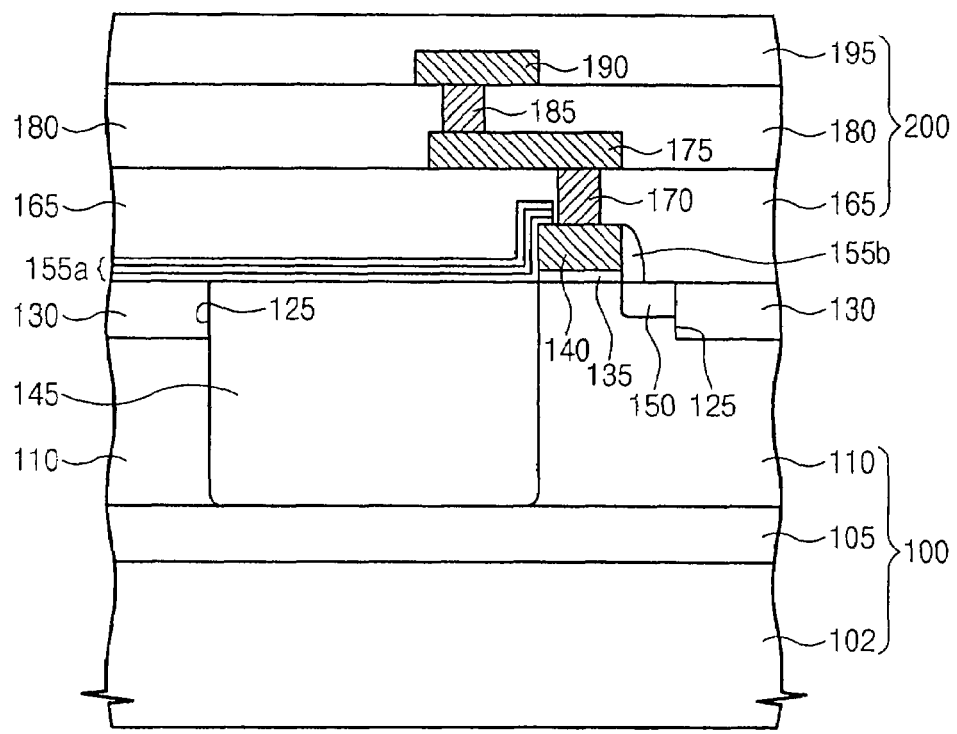
Figure 11:
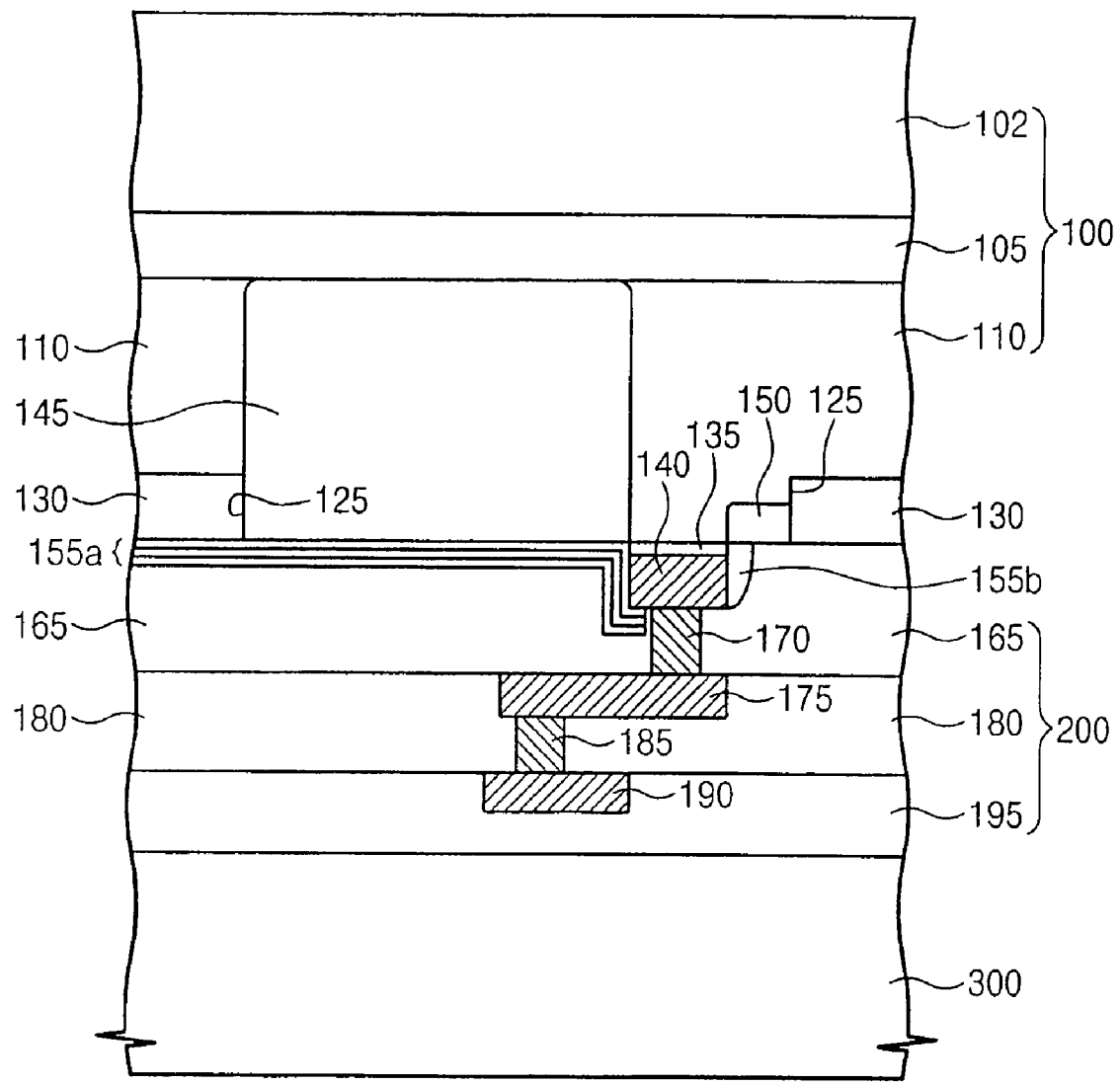

FIG. 6 is a sectional view of FIG. 1 taken along line I-I' for describing an alternate embodiment of an image sensor according to aspects of the present invention.

Referring to FIG. 6, a sidewall multi-layered reflection layer 220a' is disposed within a groove 206' formed between pixel semiconductor patterns 110a. The sidewall multi-layered reflection layer 220a' includes a first sidewall reflection layer 212a' and a second sidewall reflection layer 217a' having different refractive indexes. The first sidewall reflection layer 212a' has a refractive index different from that of the pixel semiconductor patterns 110a. In particular, the first sidewall reflection layer 212a' can have a lower refractive index than the pixel semiconductor patterns 110a and the second sidewall reflection layer 217a'. The first sidewall reflection layer 212a' is substantially conformal to both side surfaces of the groove 206' and the surface of the groove 206' proximate to a color filter 225. The second sidewall reflection layer 217a' is disposed below the first sidewall reflection layer 212a'. The first sidewall reflection layer 212a' contacts both sides of the groove 206'. The second sidewall reflection layer 217a' contacts the first sidewall reflection layer 212a'. The surface of the groove 206' neighboring the color filter 225 can contact the color filter 225. Alternately, the surface of the groove 206' neighboring the color filter 225 can be separated from the color filter 225.

The second sidewall reflection layer 217a' is disposed below the first sidewall reflection layer 212a', and can be substantially conformal to either side surfaces of the groove 206' and the surface of the groove 206' proximate to the color filter 225. In this case, the first and second sidewall reflection layers 212a' and 217a' can be alternatively disposed at least once. The first and second sidewall reflection layers 212a' and 217a' can be extended into a trench 125. Thus, a device isolation pattern 130' can include the extended portions of the first and second sidewall reflection layers 212a' and 217a'. Also, the device isolation pattern 130' can further include a device isolation insulating material, such as oxide material filling a portion of the trench 125.

Next, embodiments of methods of forming an image sensor according to aspects of the present invention will be described with reference to the drawings.

FIGS. 7 through 14 are sectional views showing an embodiment of a method of forming an image sensor according to aspects of the present invention. of the semiconductor substrate 102 (that is, the surface facing the surface adjacent to the semiconductor layer 110) to expose the semiconductor layer 110. Here, the polishing process can be a time etch process that performs etching over a predetermined duration.

Figure 13:
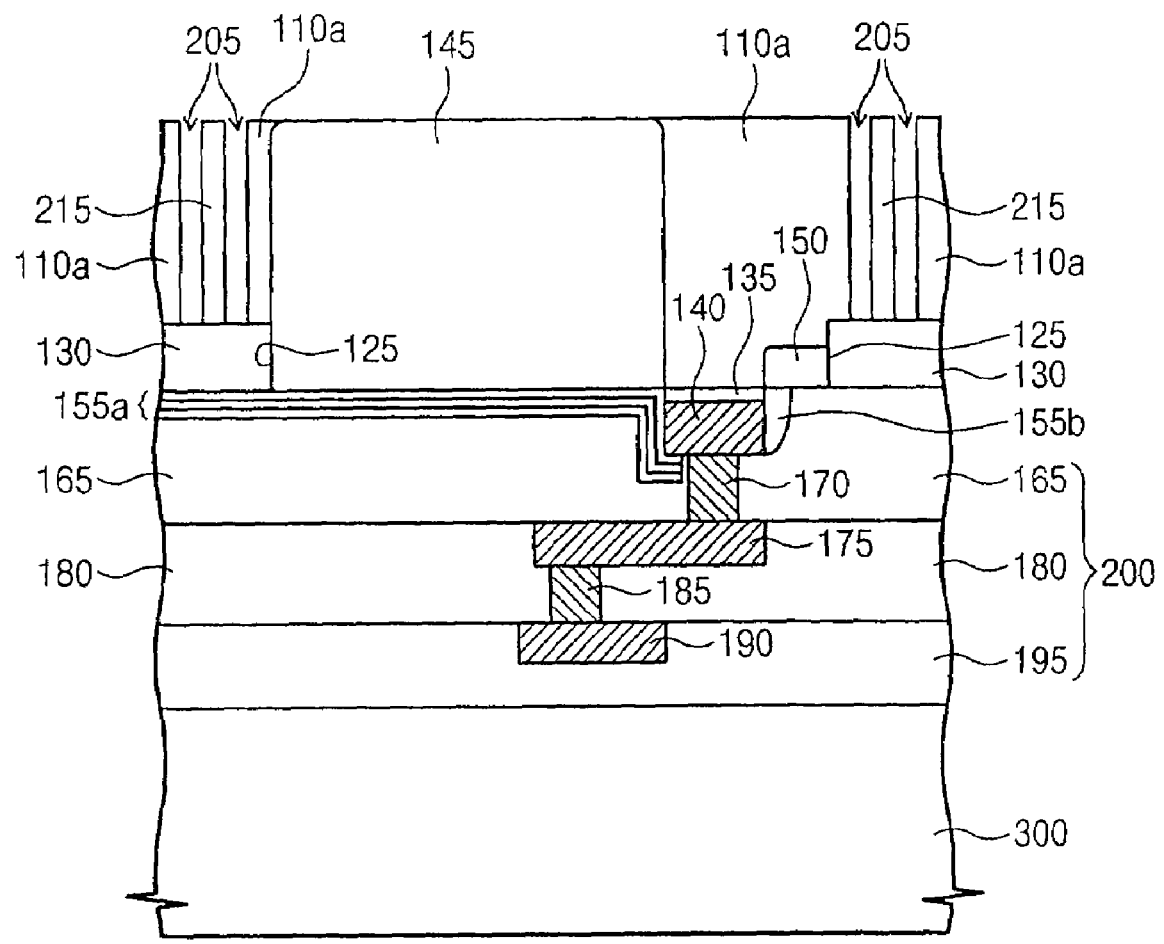

Referring to FIG. 13, the exposed second surface of the semiconductor layer 110 can selectively be etched to form a plurality of grooves 205 surrounding the pixel semiconductor patterns 110a. The grooves 205 surround one pixel semiconductor pattern 11a in layers. That is, the plurality of grooves are formed between a pair of neighboring pixel semiconductor patterns 110a. A residual portion 215 of the semiconductor layer 110 is disposed between the grooves 205.

Figure 14:
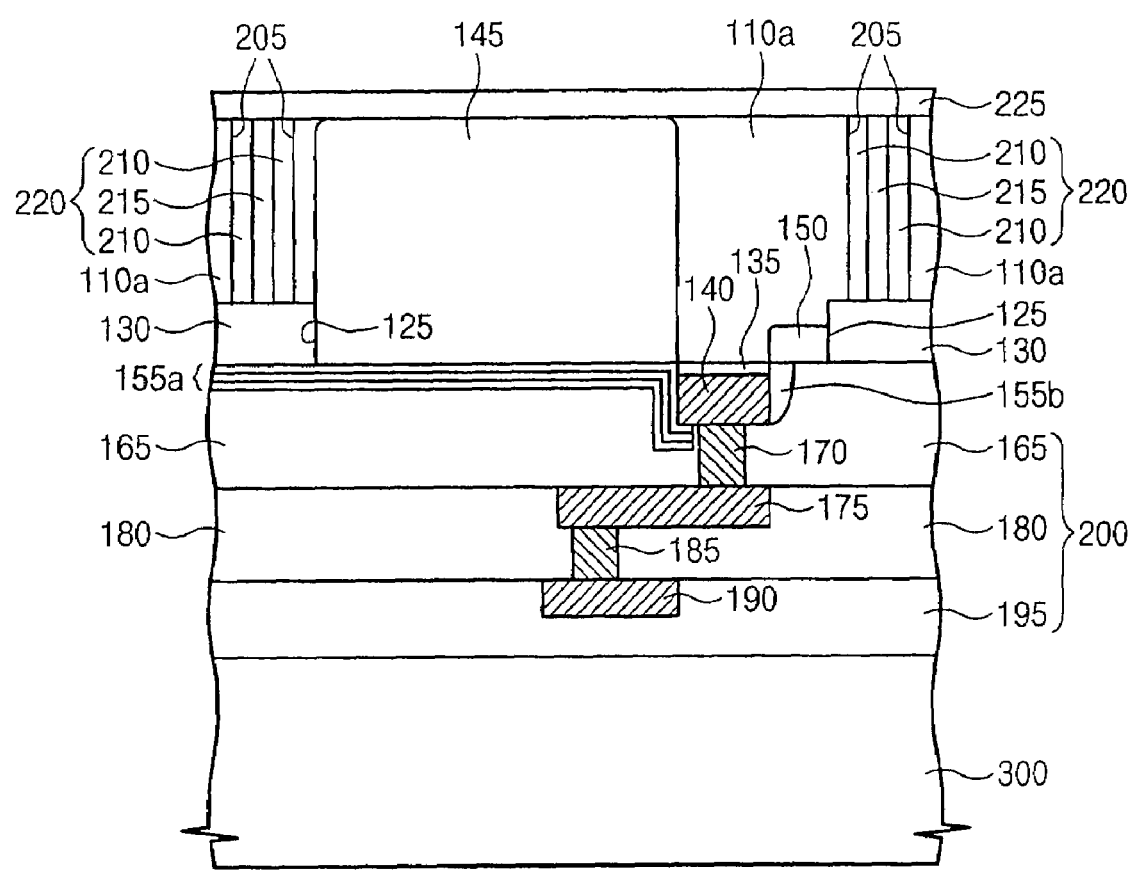

Referring to FIG. 14, the grooves 205 are filled with a predetermined material. Thus, a sidewall multi-layered reflection layer 220 is formed on the sidewall of the pixel semiconductor pattern 110a. The sidewall multi-layered reflection layer 220 includes a material layer 210 filling the grooves 205 and the residual portion 215 of the semiconductor layer 110 disposed between the grooves 205. The material layer 210 filling the grooves 205 corresponds to the first sidewall reflection layer 210 described with reference to FIGS. 1 through 4, and the residual portion 215 corresponds to the second sidewall reflection layer 215 described with reference to FIGS. 1 through 4.

The number of layers of the sidewall multi-layered reflection layer 220 formed on the side walls of the pixel semiconductor pattern 110a varies according to the number of the grooves 205. As shown, when two the grooves 205 are formed, the sidewall multi-layered reflection layer 220 has three layers. Alternately, when three the grooves 205 are formed to enclose one pixel semiconductor pattern 110a, the number of layers of the sidewall multi-layered reflection layer 220 is five.

A color filter 225 is formed over the second substrate 300 having the sidewall multi-layered reflection layer 220. The second substrate 300 having the grooves 205 can be exposed to air before the color filter 225 is formed. Here, the color filter 225 can be formed of a polymer with a high viscosity. Accordingly, the groove 205 can be filled with air, so that the first sidewall reflection layer 210 can be formed of a layer of air. Alternately, after the plurality of grooves 205 is formed, a silicon oxide layer that fills the plurality of grooves 205 can be formed, and the silicon oxide layer can be planarized until the second surface of the pixel semiconductor pattern 110a (that is, the second surface of the semiconductor layer) is exposed, to form the first sidewall reflection layer 210.

To continue, a micro lens 230 of a second conductivity is formed on the color filter 225 to realize the image sensor shown in FIG. 2.

A description of an alternate embodiment of a method for forming the sidewall multi-layered reflection layer will be given with reference to the diagrams. A method of forming an image sensor according to the alternate embodiment includes the forming methods described with reference to FIGS. 7 through 12.

Figure 15:
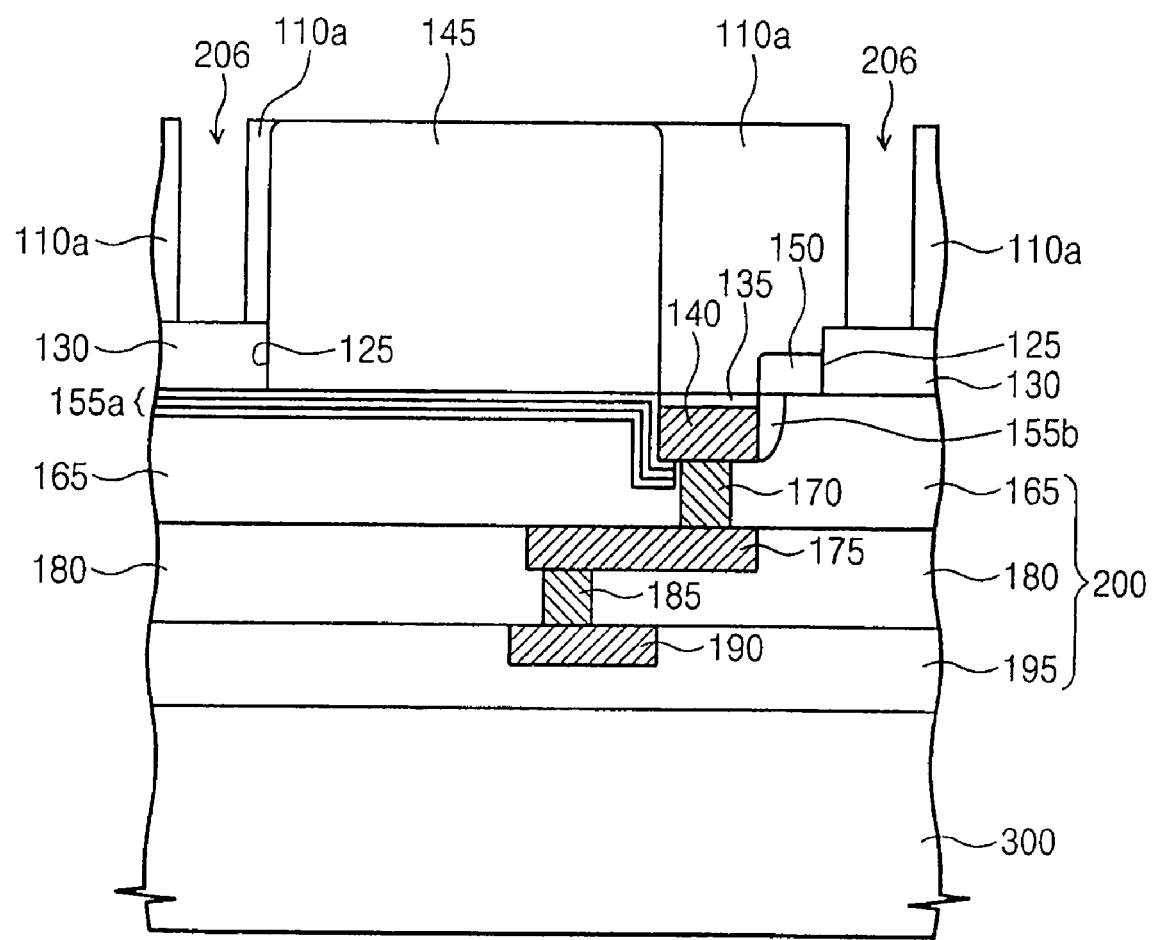
FIGS. 15 through 17 are sectional views showing an alternate embodiment of a method of forming an image sensor according to aspects of the present invention.
Figure 16:
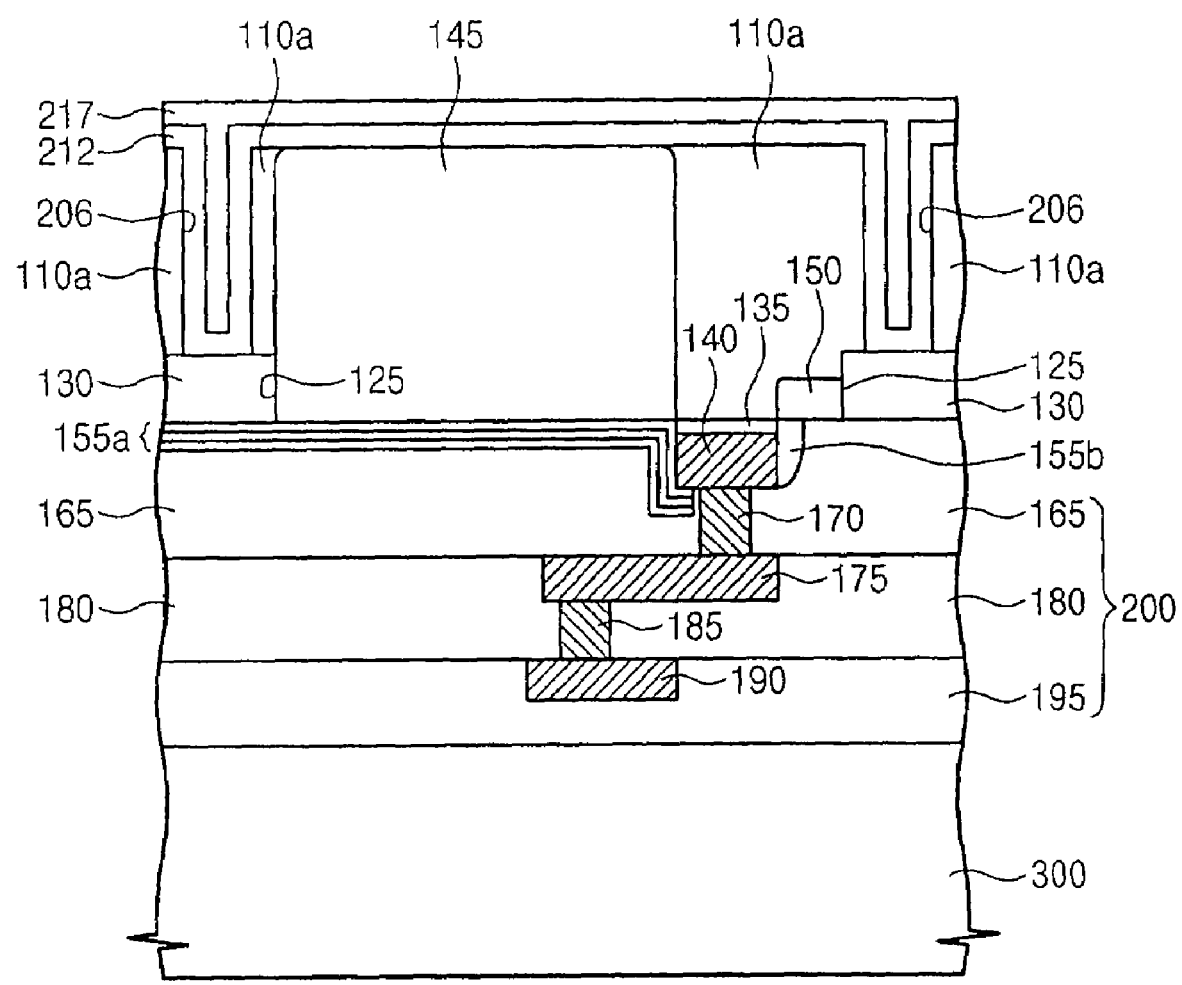
Figure 17:
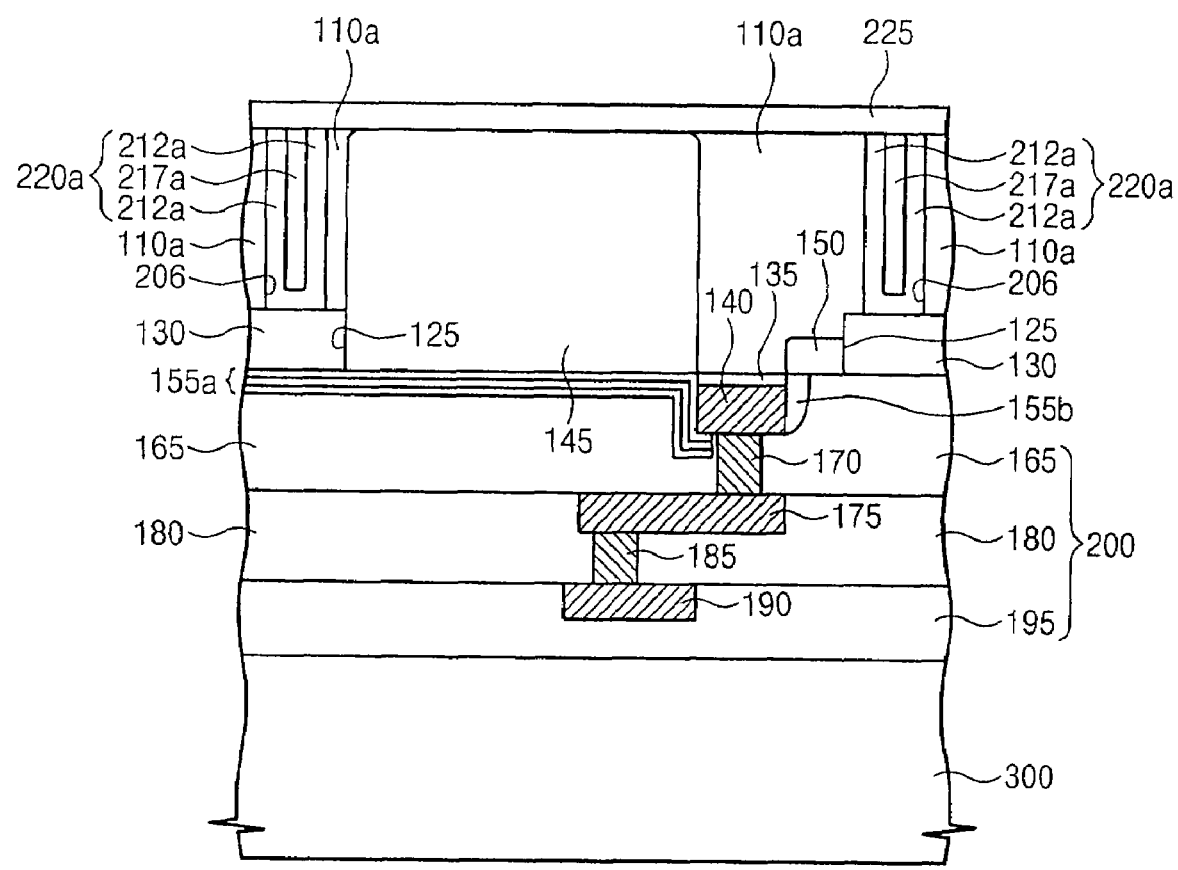

FIGS. 15 through 17 are sectional views showing an alternate embodiment of a method of forming an image sensor according to aspects of the present invention.

Figure 12:
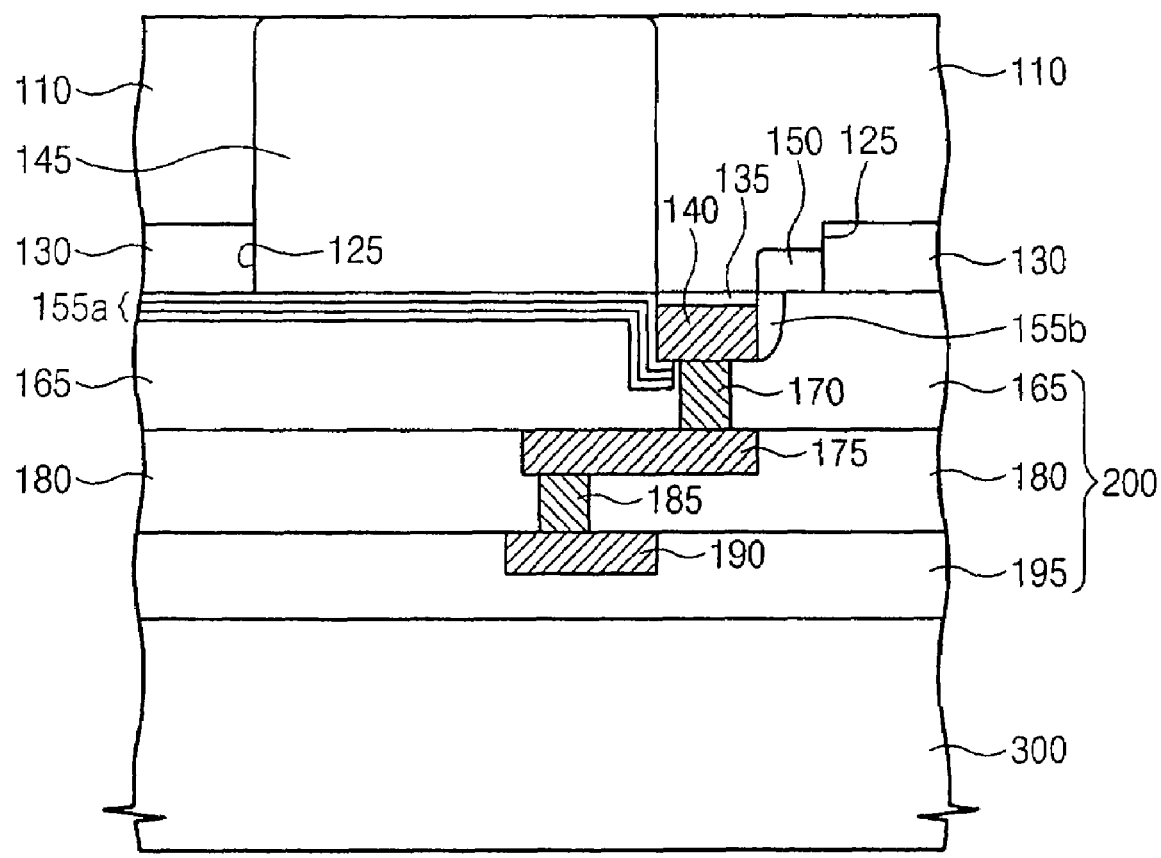

Referring to FIG. 15, after the remaining portions of the first substrate 100 are removed to expose the second surface of the semiconductor layer 110 as in FIG. 12, the exposed second surface of the semiconductor layer 110 is selectively etched to form a groove 206 for defining a pixel semiconductor pattern 110a. The pixel semiconductor pattern 110a is enclosed by one groove 206.

Referring to FIG. 16, a first material layer 212 is formed in conformity with a second substrate 300 having the groove 206, and a second material layer 217 is formed on the first material layer 212. The first material layer 212 is formed in conformity to both sides and the floor of the groove 206. The second material layer 217, as shown, is disposed on the first material layer 212, and fills the groove 206. Alternately, the second material layer 217 can also be disposed on the first material layer 212 and be formed in conformity with both sides and the floor of the groove 206. In this case, the first and second material layers 212 and 217 can be alternatively formed at least once. Here, the uppermost layer of the material layers is the first material layer 212 or the second material layer 217.

Referring to FIG. 17, the second and first material layers 217 and 212 are planarized until the pixel semiconductor pattern 110a is exposed to form a sidewall multi-layered reflection layer 220a within the groove 206. Next, a color filter 225 is formed on a second substrate 300 having the sidewall multi-layered reflection layer 220a. The micro lens 230 shown in FIG. 5 is formed on the color filter 225. Thus, the image sensor in FIG. 5 is formed.

In an alternate embodiment of a method, the sidewall multi-layered reflection layer according to aspects of the present invention can be formed before the first and second substrates are bonded. This will be described with reference to the drawings of FIGS. 18 and 19. Like elements in the present embodiment use like reference numerals.

Figure 18:
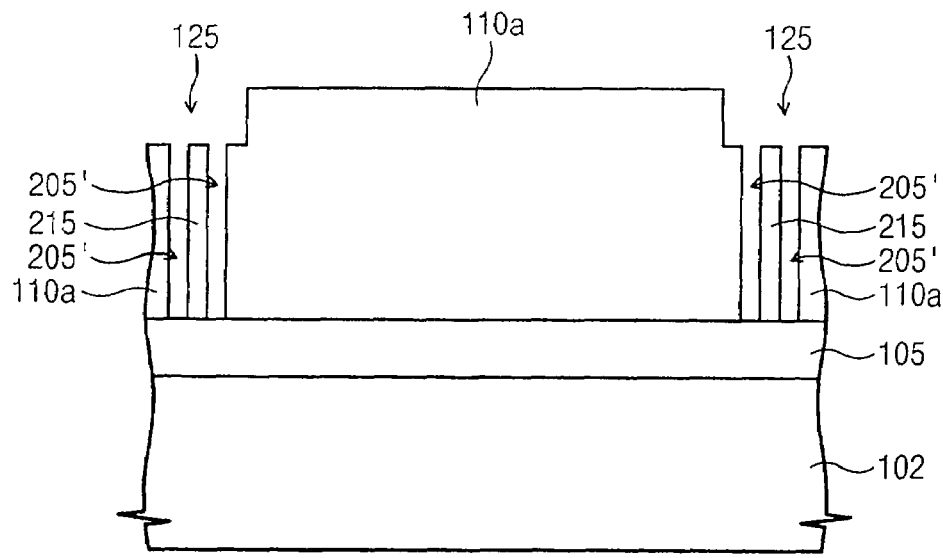
FIGS. 18 and 19 are sectional views for describing an alternate embodiment of a method for forming an image sensor according to aspects of the present invention.
Figure 19:
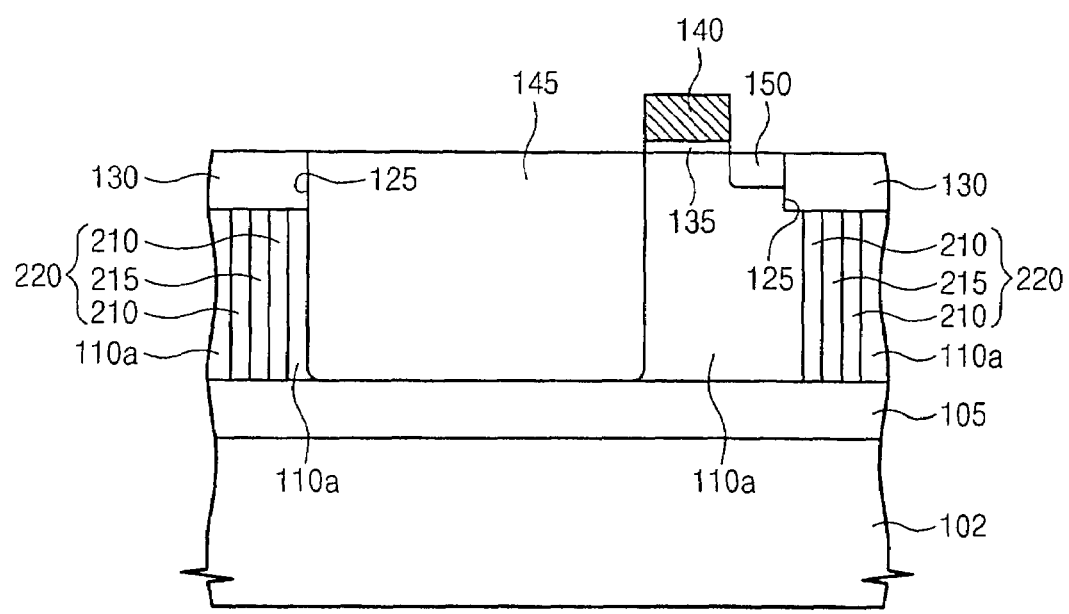

FIGS. 18 and 19 are sectional views for describing an alternate embodiment of a method for forming an image sensor according to aspects of the present invention. The forming method of an image sensor according to the alternate example can include the method of forming the trench 125 that limits the active region depicted in FIG. 7.

Referring to FIG. 18, a first substrate 100 having a semiconductor layer 110 is prepared, after which the semiconductor layer 110 is patterned to form a trench 125 that restricts an active region. Next, the floor of the trench 125 is selectively etched to form a plurality of grooves 205'. The plurality of grooves 205' defines a pixel semiconductor pattern 110a. That is, the plurality of grooves 205' encloses one pixel semiconductor pattern 110a in layers. The grooves 205' are spaced apart from one another. Thus, the residual portion 215 of the semiconductor layer 110 is left between the grooves 205'.

Referring to FIG. 19, an oxide layer if formed to fill the trench 125 and the grooves 205'. Here, the portion of the oxide layer filling the trench 125 corresponds to a device isolation pattern 130, and the portion of the oxide layer filling the groove 205' corresponds to a first sidewall reflection layer 210. The residual portion 215 of the semiconductor layer 110 between the grooves 205' is a second sidewall reflection layer 215. Thus, a sidewall multi-layered reflection layer 220 is formed on the sidewall of the pixel semiconductor pattern 110a.

Next, a gate insulation layer 135 and a gate electrode 140 are formed in sequence on the active region defined by the device isolation pattern 130, a photodiode 145 is formed on the active region on one side of the gate electrode 140, and a floating doped region 150 is formed on the active region on the other side of the gate electrode 140. The subsequent processes can be performed in the same manner as in the preceding description with reference to FIGS. 9 through 12. By forming a color filter 225 on a second surface of the pixel semiconductor pattern 110a exposed after the removal of a separation layer 105 and a semiconductor substrate 102 (being the remaining portions of the first substrate 100), and forming a micro lens 230 on the color filter 225, the image sensor according to aspects of the present invention can be formed.

Next, an embodiment of a method of forming the image sensor in FIG. 6 will be described. In this method, the sidewall multi-layered reflection layer is also formed before the first and second substrates are bonded. Like elements as those described above also use like reference numerals in the present alternate embodiment.

Figure 20:
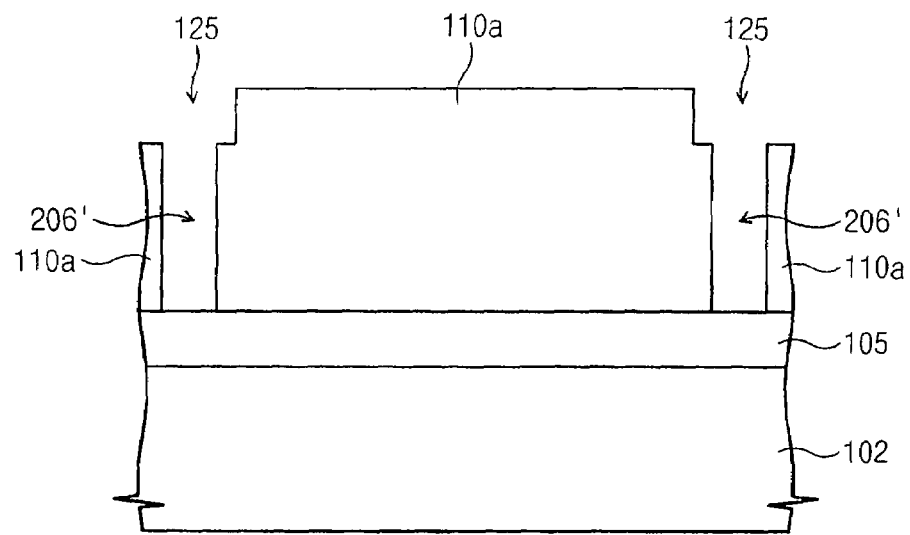
FIGS. 20 through 22 are sectional views for describing another alternate embodiment of a method of forming an image sensor according to aspects of the present invention.
Figure 21:
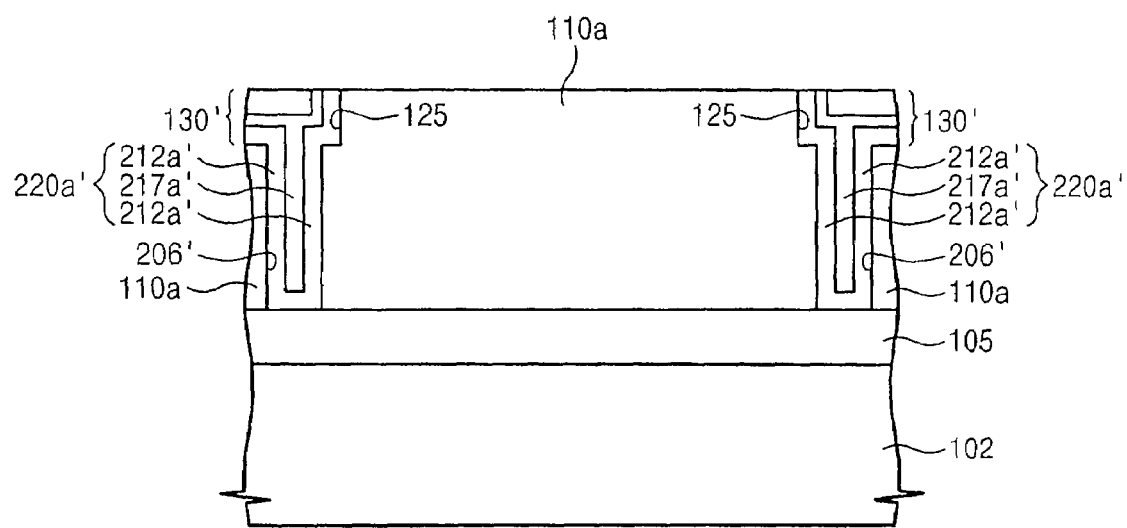
Figure 22:
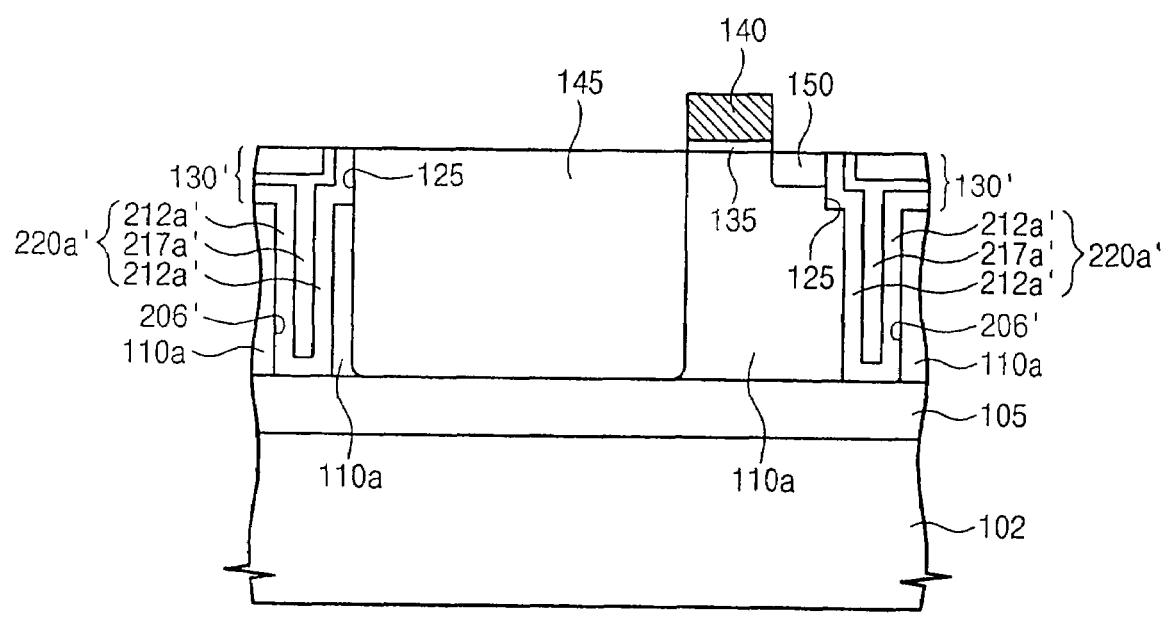

FIGS. 20 through 22 are sectional views for describing an alternate method of forming an image sensor according to embodiments of the present invention. The method of forming the image sensor according to the present alternate example can include the forming of the trench 125 that limits the active region described with reference to FIG. 7.

Referring to FIG. 20, after a trench 125 for limiting an active region on a silicon layer 110 included on a first substrate 100 is formed, a groove 206' is formed through selectively etching the floor of the trench 125. The groove 206' defines a pixel semiconductor pattern 110a, whereby one groove 206' encloses the pixel semiconductor pattern 110a. That is, one groove 206' is formed between a pair of adjacent pixel semiconductor patterns 110a.

Referring to FIG. 21, a first material layer is formed in conformity to a first pattern 100 having the groove 206' and the trench 125, and a second material layer is formed on the first material layer. The first material layer is formed in conformity on both side surfaces and the floor of the groove 206'. The second material layer can fill the groove 206', as shown. Alternately, the second material layer can be disposed on the first material layer and be disposed in conformity to both side surfaces and the floor of the groove 206'. In this case, the first and second material layers can be alternatingly formed at least once. Here, the uppermost layer of the material layers can be the first material layer or the second material layer. The first and second material layers are also formed inside the trench 125. After the first and second material layers are formed, if a portion of the trench 125 is unfilled, an oxide layer 129 can be used to fill the unfilled portion of the trench 125.

In addition, the oxide layer 129 and the second and first material layers are planarized until the pixel semiconductor pattern 110a is exposed. Thus, a device isolation layer 130' and a sidewall multi-layered reflection layer 220a' are formed. The sidewall multi-layered reflection layer 220a includes a first sidewall reflection layer 212a' and a second sidewall reflection layer 217a'. The first and second sidewall reflection layers 212a' and 217a' are respectively a portion of a first material layer and a portion of a second material layer disposed on the groove 206'. As a detailed description of the first and second sidewall reflection layers 212a' and 217a' has already been provided with reference to FIG. 6, a repetition thereof will be omitted.

Referring to FIG. 22, a gate insulating layer 135 and a gate electrode 140 are formed in sequence on the active region defined by the device isolation pattern 130', a photodiode 145 is formed on the active region on one side of the gate electrode 140, and a floating doped region 150 is formed on the active region on the other side of the gate electrode 140. The following processes can be the same as those already described with reference to FIGS. 9 through 12. The color filter 225 and micro lens 230 in FIG. 6 can be formed on the second surface of the exposed pixel semiconductor pattern 110a after the removal of the remaining portion of the first substrate 100, thereby forming the image sensor shown in FIG. 6.

As described above, according to the present invention, a photodiode that admits light is disposed on the upper portion of a substrate, and an interlayer insulating layer is interposed between the photodiode and the substrate. Here, a base multi-layered reflection layer is disposed between the photodiode and the interlayer insulating layer. Thus, light that is incident on the photodiode is reflected by the base multi-layered reflection layer and re-enters the photodiode. Resultantly, the sensitivity of the image sensor is improved.

Also, a sidewall multi-layered reflection layer encloses the sidewalls of the pixel semiconductor patterns forming the photodiode. Therefore, incidence of the light reflected by the base multi-layered reflection layer on neighboring pixels can be minimized. As a result, interference between pixels can be minimized by the sidewall multi-layered reflection layer in order to minimize image distortion in the image sensor.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An image sensor comprising:
   a pixel semiconductor pattern disposed on a substrate;
   an interlayer insulating layer interposed between the pixel semiconductor pattern and the substrate;
   a photodiode in the pixel semiconductor pattern;
   a base multi-layered reflection layer interposed between the photodiode and the interlayer insulating layer, wherein the base multi-layered reflection layer includes a plurality of layers with different refractive indexes relative to each other, and a refractive index of a layer of the base multi-layered reflection layer that contacts the pixel semiconductor pattern is different from a refractive index of the pixel semiconductor pattern; and wherein the base multi-layered reflection layer includes a first base reflection layer and a second base reflection layer that are stacked, wherein:
   the first base reflection layer has a refractive index that is lower than refractive indexes of the second base reflection layer and the pixel semiconductor pattern,
   a layer of the base multi-layered reflection layer that contacts the pixel semiconductor pattern is the first base reflection layer, and
   the first and second base reflection layers are alternatingly stacked at least once
   a sidewall multi-layered reflection layer disposed on a sidewall of the pixel semiconductor pattern, wherein the sidewall multi-layered reflection layer surrounds the photodiode.

2. The image sensor of claim 1, wherein the layers of the base multi-layered reflection layer have thicknesses that induce constructive interference of light reflected by at least one boundary of the base multi-layered reflection layer and a boundary between the base multi-layered reflection layer and the pixel semiconductor pattern.

3. The image sensor of claim 1, further comprising:
   a color filter covering the pixel semiconductor pattern; and
   a micro lens disposed on the color filter and covering the photodiode, wherein the pixel semiconductor pattern is disposed between the color filter and the substrate.

* * * * *